(12) United States Patent
Hung

(10) Patent No.: US 10,438,875 B2
(45) Date of Patent: Oct. 8, 2019

(54) DUAL-CHIP PACKAGE STRUCTURE

(71) Applicant: Lyontek Inc., Hsinchu (TW)

(72) Inventor: Chi-Cheng Hung, Hsinchu (TW)

(73) Assignee: LYONTEK INC., Hsinchu (TW)

( * ) Notice: Subject to any disclaimer, the term of this patent is extended or adjusted under 35 U.S.C. 154(b) by 0 days.

(21) Appl. No.: 15/973,500

(22) Filed: May 7, 2018

(65) Prior Publication Data

US 2019/0189546 A1 Jun. 20, 2019

(30) Foreign Application Priority Data

Dec. 15, 2017 (TW) .............................. 106144278 A

(51) Int. Cl.
*H01L 23/495* (2006.01)
*H01L 23/31* (2006.01)

(52) U.S. Cl.
CPC .... *H01L 23/49568* (2013.01); *H01L 23/3114* (2013.01); *H01L 23/4952* (2013.01); *H01L 23/49503* (2013.01); *H01L 23/49575* (2013.01); *H01L 2224/48091* (2013.01); *H01L 2924/181* (2013.01)

(58) Field of Classification Search
CPC ......... H01L 23/49568; H01L 23/49503; H01L 23/4952; H01L 23/3114; H01L 23/49575
See application file for complete search history.

(56) References Cited

U.S. PATENT DOCUMENTS

| | | | | |
|---|---|---|---|---|
| 2001/0046167 A1* | 11/2001 | Ayukawa | ................. | G11C 5/04 365/200 |
| 2007/0267742 A1* | 11/2007 | Tai | .................... | H01L 23/49562 257/728 |
| 2011/0254143 A1* | 10/2011 | Chen | .................. | H01L 23/4952 257/676 |
| 2015/0332747 A1* | 11/2015 | Chan | ....................... | G11C 8/18 365/233.1 |
| 2017/0090813 A1* | 3/2017 | Tailliet | ..................... | G11C 8/12 |
| 2018/0293192 A1* | 10/2018 | Hung | .................. | G06F 13/1694 |

* cited by examiner

*Primary Examiner* — Kyoung Lee
*Assistant Examiner* — Christina A Sylvia
(74) *Attorney, Agent, or Firm* — LanWay IPR Services; Chun-Ming Shih

(57) ABSTRACT

A dual-chip package structure is configured to electrically connect a first CS bonding pad of a non-volatile memory chip to a CS pin of a lead frame and electrically connect a second CS bonding pad of a volatile memory chip to a heat-dissipating exposed pad, so as to provide a non-volatile memory chip select signal for the non-volatile memory chip through the CS pin, and provide a volatile memory chip select signal for the volatile memory chip through the heat-dissipating exposed pad. This achieves a low pin count dual-chip package structure, which can effectively reduce the cost and avoid conflict between the two chips.

14 Claims, 6 Drawing Sheets

DUAL-CHIP PACKAGE STRUCTURE

CROSS-REFERENCE TO RELATED APPLICATIONS

This application claims the priority of Republic of China Patent Application No. 106144278 filed on Dec. 15, 2017, in the State Intellectual Property Office of the R.O.C., the disclosure of which is incorporated herein by reference.

BACKGROUND OF THE INVENTION

Field of the Invention

The invention relates to semiconductor packages, and more particularly, to a dual-chip package structure.

Descriptions of the Related Art

General non-volatile memories (such as FLASH) have large storage capacities such that they can still save data even when they are shut down, but they undesirably have a low read/write speed especially very slow writing and thus sometimes need a burner for writing. Volatile memories (such as SRAM) have smaller storage capacities and data would disappear if they are shut down. They advantageously have a high read/write speed. It is therefore common to practically use both types of the memories at the same time, and accordingly there has been proposed integrating these two types of memories in a single package structure, which desirably reduces the size of chip package and simplifies the design of printed circuit board (PCB) as well as reduces the cost.

However, if two or more SPI (Serial Peripheral Interface) memory chips are directly integrated in a single package structure, conflict often occurs between the chips because it is not able to determine which SPI memory chip is performing access operation. Thus the package structure must have two CS (Chip Select) pins for determining which SPI memory chip is performing access operation. Particularly in a conventional SPI memory single chip package structure, its lead frame has eight pins that are electrically connected to eight bonding pads of the chip respectively. Provided that there are two chips in the same package structure, there must be added one more CS pin to the lead frame in order to prevent conflict between the chips, which means that the lead frame must have two CS pins for being connected to CS bonding pads of the two chips respectively. For such a dual-chip package structure, its lead frame has ten pins (one is blank) rather than original eight pins so as to distinguish the two different chips in the package structure. This design undoubtedly increases the size of chip package and its fabrication cost.

How to solve the problem of conflict between different memory chips in a package structure having eight-pin lead frame, is therefore an important technical task to be resolved in the art.

SUMMARY OF THE INVENTION

In view of the above drawbacks in the conventional technology, a primary object of the invention is to provide a dual-chip package structure, which uses a lead frame having only eight pins can prevent conflict between a non-volatile memory chip and a volatile memory chip in the dual-chip package structure.

Another object of the invention is to provide a dual-chip package structure, which can prevent conflict between a non-volatile memory chip and a volatile memory chip during a burning process.

For the objects said above and for other objects, the invention provides a dual-chip package structure for receiving a non-volatile memory chip select signal transmitted from a printed circuit board, and for selectively receiving a volatile memory chip select signal transmitted from the printed circuit board, the dual-chip package structure including: a heat-dissipating exposed pad selectively electrically connected to the printed circuit board, for receiving the volatile memory chip select signal; a non-volatile memory chip having eight bonding pads, wherein the eight bonding pads include at least a first CS bonding pad; a volatile memory chip having eight bonding pads, wherein the eight bonding pads include at least a second CS bonding pad; a lead frame having eight pins, wherein the eight pins include at least a CS pin for receiving the non-volatile memory chip select signal; a first CS wire electrically connected to the CS pin and the first CS bonding pad, for providing the non-volatile memory chip select signal for the first CS bonding pad; and a second CS wire electrically connected to the heat-dissipating exposed pad and the second CS bonding pad, for providing the volatile memory chip select signal for the second CS bonding pad.

Optionally, the dual-chip package structure of the invention said above, further includes a pull-up resistor, and the eight pins of the lead frame further including at least a VCC pin, wherein the pull-up resistor is electrically connected to the VCC pin and the second CS bonding pad respectively, and is for inputting a pull-up signal to the second CS bonding pad when the heat-dissipating exposed pad is not electrically connected to the printed circuit board, so as to allow the second CS bonding pad to receive a high level signal and use it as the volatile memory chip select signal to make the volatile memory chip disabled.

Optionally, the dual-chip package structure of the invention said above, further includes at least a third wire for electrically connecting the pull-up resistor to the VCC pin and the second CS bonding pad respectively.

Optionally, the dual-chip package structure of the invention said above, further includes a pull-down resistor, and the eight pins of the lead frame further including at least a GND pin, wherein the pull-down resistor is electrically connected to the GND pin and the second CS bonding pad respectively, and is for inputting a pull-down signal to the second CS bonding pad when the heat-dissipating exposed pad is not electrically connected to the printed circuit board, so as to allow the second CS bonding pad to receive a low level signal and use it as the volatile memory chip select signal to make the volatile memory chip disabled.

Optionally, the dual-chip package structure of the invention said above, further includes at least a fourth wire for electrically connecting the pull-down resistor to the GND pin and the second CS bonding pad respectively.

Optionally, the dual-chip package structure of the invention said above, further includes a pull-up resistor, the eight bonding pads of the volatile memory chip further including at least a VCC bonding pad, and the eight pins of the lead frame further including at least a VCC pin, wherein the pull-up resistor is integrated in the volatile memory chip, the VCC bonding pad is electrically connected to the VCC pin, and the pull-up resistor is electrically connected to the VCC bonding pad and the second CS bonding pad respectively, wherein the pull-up resistor is for inputting a pull-up signal to the second CS bonding pad when the heat-dissipating exposed pad is not electrically connected to the printed circuit board, so as to allow the second CS bonding pad to receive a high level signal and use it as the volatile memory chip select signal to make the volatile memory chip disabled, wherein the pull-up resistor is a semiconductor resistance element or a weakly-driven transistor.

Optionally, the dual-chip package structure of the invention said above, further includes a fifth wire for electrically connecting the VCC bonding pad to the VCC pin.

Optionally, the dual-chip package structure of the invention said above, further includes a pull-down resistor, the eight bonding pads of the volatile memory chip further including at least a GND bonding pad, and the eight pins of the lead frame further including at least a GND pin, wherein the pull-down resistor is integrated in the volatile memory chip, the GND bonding pad is electrically connected to the GND pin, and the pull-down resistor is electrically connected to the GND bonding pad and the second CS bonding pad respectively, wherein the pull-down resistor is for inputting a pull-down signal to the second CS bonding pad when the heat-dissipating exposed pad is not electrically connected to the printed circuit board, so as to allow the second CS bonding pad to receive a low level signal and use it as the volatile memory chip select signal to make the volatile memory chip disabled, wherein the pull-down resistor is a semiconductor resistance element or a weakly-driven transistor.

Optionally, the dual-chip package structure of the invention said above, further includes a sixth wire for electrically connecting the GND bonding pad to the GND pin.

Optionally, the dual-chip package structure of the invention said above, wherein the second CS bonding pad of the volatile memory chip is activated at a low level.

Optionally, the dual-chip package structure of the invention said above, wherein the second CS bonding pad of the volatile memory chip is activated at a high level.

Optionally, the dual-chip package structure of the invention said above, wherein the non-volatile memory chip is FLASH chip, and the volatile memory chip is SRAM chip.

Optionally, the dual-chip package structure of the invention said above, wherein the non-volatile memory chip and the volatile memory chip are each a SPI chip, Dual-SPI chip or Quad-SPI chip having at least eight bonding pads.

Particularly in the dual-chip package structure of the invention, a first CS bonding pad of the non-volatile memory chip is electrically connected to a CS pin of the lead frame, and a second CS bonding pad of the volatile memory chip is electrically connected to a heat-dissipating exposed pad. The non-volatile memory chip is provided with non-volatile memory chip select signals through the CS pin of the lead frame, and the volatile memory chip is provided with volatile memory chip select signals through the heat-dissipating exposed pad. The invention thus requires the lead frame only having eight pins but can prevent conflict between the two chips in the dual-chip package structure.

Moreover, in a burning process performed by the dual-chip package structure, with a pull-up resistor or a pull-down resistor being further provided, pull-up or pull-down signals can be inputted to the second CS bonding pad of the volatile memory chip, such that when the second CS bonding pad is in a floating state, the volatile memory chip certainly remains in a disabled state. This effectively avoids conflict between the non-volatile memory chip and the volatile memory chip, and prevents a burner used in the burning process from data checking failed while performing a write verify procedure on burned data of the non-volatile memory chip, as well as achieves advantages of easy implementation and low fabrication cost of the dual-chip package structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
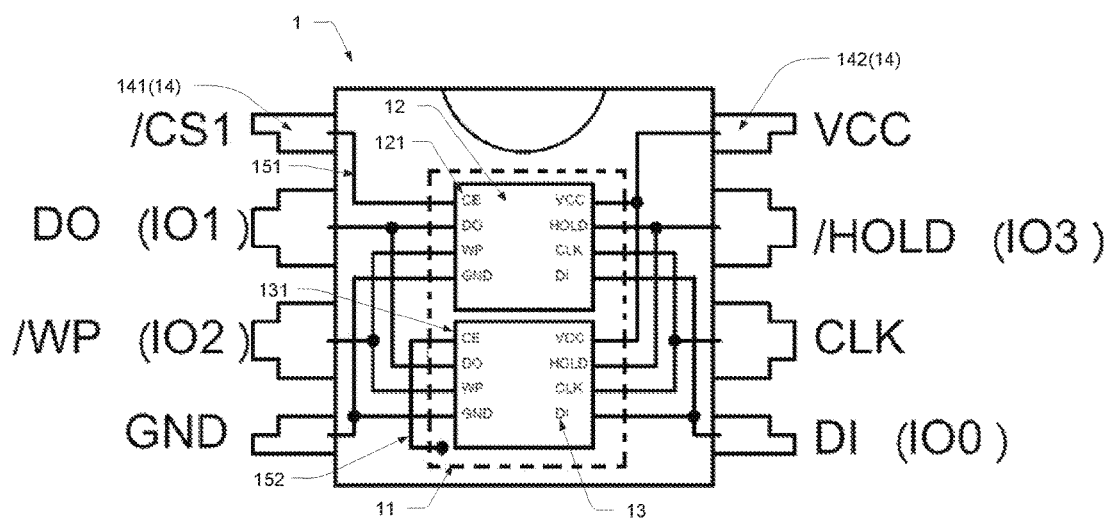
FIG. 1 is a schematic diagram showing basic architecture of a dual-chip package structure of the invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 4:
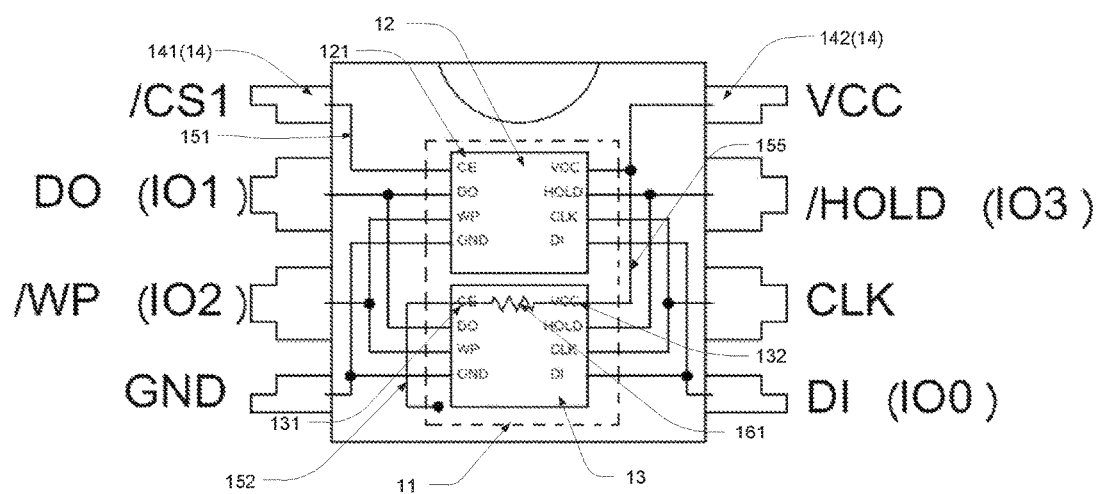
Figure 5:
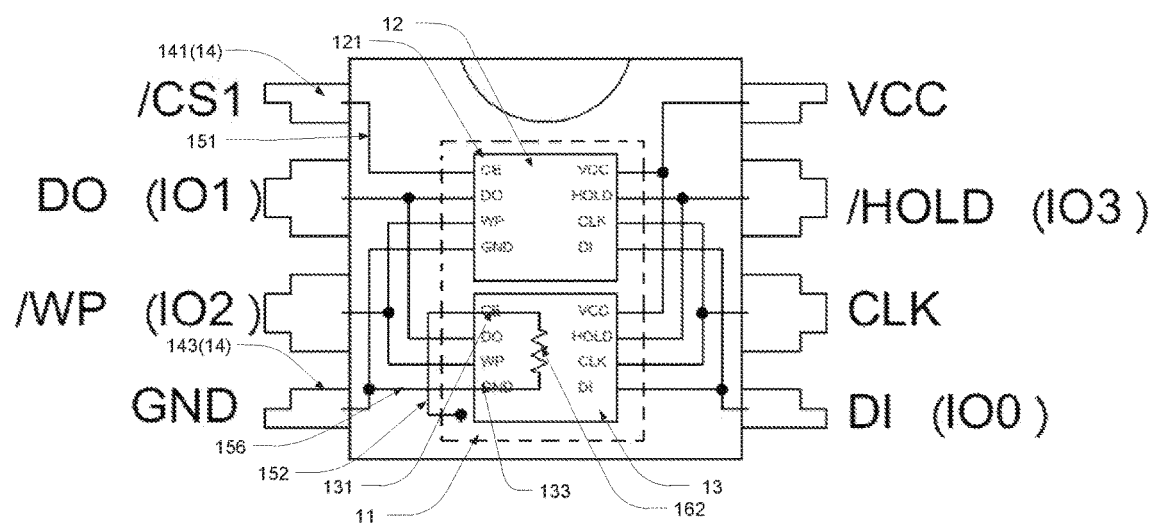
Figure 6:
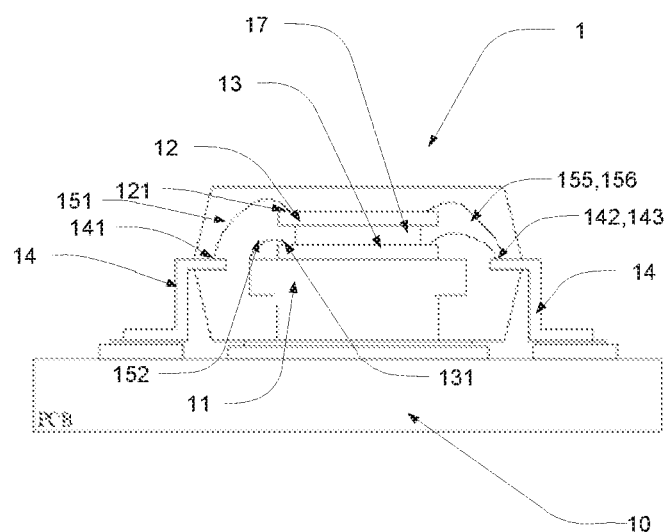
FIG. 6 is a side view of the dual-chip package structure of FIG. 1.

Referring to FIGS. 1 to 6, FIG. 1 is a schematic diagram showing basic circuit architecture of a dual-chip package structure 1 of the invention, and FIG. 6 is a side view of the dual-chip package structure of FIG. 1. The dual-chip package structure 1 of the invention is applicable to Serial Flash, Serial SRAM or a combination of two different Serial Interface memories, thereby capable of receiving non-volatile memory chip select signals transmitted from a printed circuit board 10 (shown in FIG. 6) or selectively receiving volatile memory chip select signals transmitted from the printed circuit board 10. As shown in the drawings, the dual-chip package structure 1 includes a heat-dissipating exposed pad 11, a non-volatile memory chip 12, a volatile memory chip 13, a lead frame 14, a first CS wire 151 and a second CS wire 152. The non-volatile memory chip 12 and the volatile memory chip 13 are each a SPI chip, Dual-SPI chip or Quad-SPI chip, having at least eight bonding pads. There is an insulation layer 17 between the non-volatile memory chip 12 and the volatile memory chip 13, allowing the non-volatile memory chip 12 and the volatile memory chip 13 to be stacked on the heat-dissipating exposed pad 11, so as to reduce the overall package size.

The heat-dissipating exposed pad 11 is selectively electrically connected to the printed circuit board 10 and thus is capable of receiving volatile memory chip select signals transmitted from the printed circuit board 10. In one embodiment, the heat-dissipating exposed pad 11 may be located directly under the dual-chip package structure 1, for dissipating heat from the chips in the dual-chip package structure 1.

The non-volatile memory chip 12 and the volatile memory chip 13 are selectively stacked on the heat-dissipating exposed pad 11 so as to reduce the overall package size. The non-volatile memory chip 12 is, for example, a FLASH chip having eight bonding pads, wherein the eight bonding pads include at least a first CS bonding pad 121. In one embodiment, besides the first CS bonding pad 121, the non-volatile memory chip 12 further includes DO(IO1) bonding pad, WP(IO2) bonding pad, GND bonding pad, DI(IO0) bonding pad, CLK bonding pad, HOLD(IO3) bonding pad and VCC bonding pad. It should be noted that the names and order of those bonding pads are not limited to what are described here but can be modified and adjusted according to practical need.

The volatile memory chip 13 is, for example, a SRAM chip and at least has eight bonding pads, wherein the eight bonding pads include at least a second CS bonding pad 131. In this embodiment, besides the second CS bonding pad, the volatile memory chip 13 further includes DO(IO1) bonding pad, WP(IO2) bonding pad, GND bonding pad 133, DI(IO0) bonding pad, CLK bonding pad, HOLD(IO3) bonding pad and VCC bonding pad 132. It should be noted that the names and order of those bonding pads are not limited to what are described here but can be modified and adjusted according to practical need.

The lead frame 14 has eight pins, wherein the eight pins are formed in a manner corresponding to the types of bonding pads of the non-volatile memory chip 12 and the volatile memory chip 13. In one embodiment, the eight pins include CS pin 141, DO(IO1) pin, WP(IO2) pin, GND pin 143, DI(IO0) pin, CLK pin, HOLD(IO3) pin and VCC pin 142. It should be noted that the names and order of those pins are not limited to what are described here but can be modified and adjusted according to practical need.

The CS pin 141 of the lead frame 14 (that is, /CS1 shown in FIG. 1) is used to receive non-volatile memory chip select signals transmitted by the printed circuit board 10. Particularly, the CS pin 141 of the lead frame 14 is electrically connected to the first CS bonding pad 121 of the non-volatile memory chip 12 through a first CS wire 151, to provide the non-volatile memory chip select signals for the first CS bonding pad 121, which thereby allow the non-volatile memory chip 12 to operate accordingly.

Moreover, the second CS bonding pad 131 of the volatile memory chip 13 is electrically connected to the heat-dissipating exposed pad 11 through a second CS wire 152, such that with the heat-dissipating exposed pad 11 being electrically connected to the printed circuit board 10, the second CS bonding pad 131 provides volatile memory chip select signals for the second CS bonding pad 131 and thereby allows the volatile memory chip 13 to operate accordingly.

It should be noted that, burners currently available on the market are mostly designed for use with single chip non-volatile memory package structures. In this case, the above dual-chip package structure 1 shown in FIG. 1, when performing a burning process, would have its bottom heat-dissipating exposed pad 1 and the second CS bonding pad 131 of the volatile memory chip 13 (which is electrically connected to the heat-dissipating exposed pad 11) stay in a floating state, making a current burner not able to provide volatile memory chip select signals for the volatile memory chip 13. This is not lead the non-volatile memory chip 12 to wrongly burn data; however, a write verify procedure normally performed after data writing in the burning process, if the volatile memory chip 13 is in an enabled state, conflict occurs between the non-volatile memory chip 12 and the volatile memory chip 13 in the dual-chip package structure operating at the same time, and may cause the burner checking data failed while performing the write verify procedure on burned data of the non-volatile memory chip 12. Accordingly in one embodiment, there is further provided a pull-up resistor or a pull-down resistor, in order to solve the above technical problem.

Figure 2:
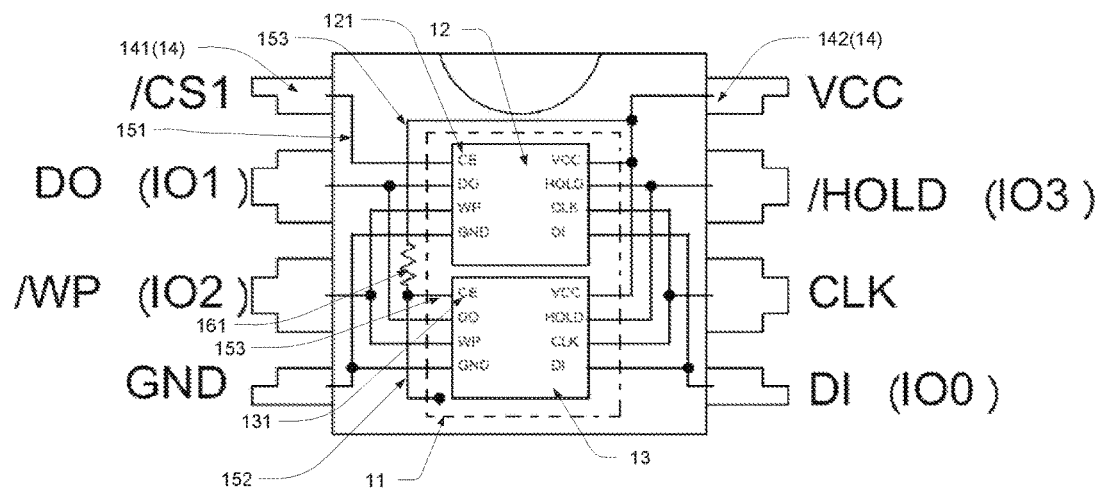
FIGS. 2 to 5 are schematic diagrams showing different embodiments of the dual-chip package structure of FIG. 1.

Referring to FIG. 2, in one embodiment, the second CS bonding pad 131 of the volatile memory chip 13 in the dual-chip package structure 1 is activated at a low level (which means, the second CS bonding pad 131 receives low level signals and uses the low level signals as volatile memory chip select signals to enable the volatile memory chip 13). The dual-chip package structure 1 further includes a pull-up resistor 161, which is electrically connected to the VCC pin 142 of the lead frame 14 and the second CS bonding pad 131 respectively. When the heat-dissipating exposed pad 11 is not electrically connected to the printed circuit board 10, that is, the second CS bonding pad 131 of the volatile memory chip 13 is in the floating state, the pull-up resistor 161 inputs pull-up signals to the second CS bonding pad 131, and the second CS bonding pad 131 receives high level signals and uses them as volatile memory chip select signals to make the volatile memory chip 13 disabled. In this embodiment, the VCC pin 142 of the lead frame 14 is used to provide power for the non-volatile memory chip 12 and the volatile memory chip 13 to operate.

Preferably, the dual-chip package structure 1 further includes a third wire 153 for electrically connecting the pull-up resistor 161 to the VCC pin 142 and the second CS bonding pad 131 respectively. It should be noted that, the third wire 153 can be composed of a plurality of conductive wires, and its number and connection are not limited to those shown in FIG. 2 but can be adjusted according to practical need. With the pull-up resistor 161 providing pull-up signals for the second CS bonding pad 131, when the second CS bonding pad 131 is in the floating state, the volatile memory chip 13 remains in a closed or disabled state, thereby preventing the above problem of the burner used in the burning process from data checking failed while performing the write verify procedure on burned data of the non-volatile memory chip 12.

Figure 3:
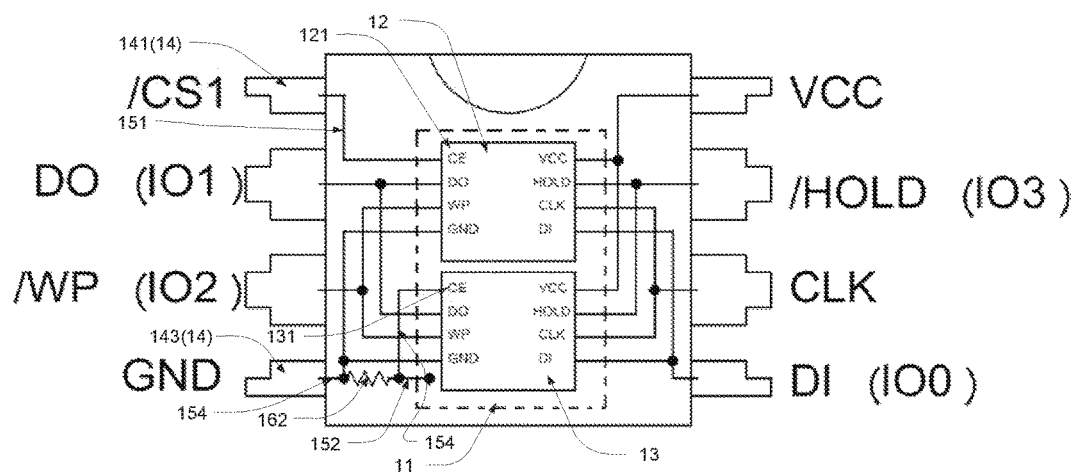

Referring to FIG. 3, in one embodiment, the second CS bonding pad 131 of the volatile memory chip 13 in the dual-chip package structure 1 is activated at a high level (which means, the second CS bonding pad 131 receives high level signals and uses the high level signals as volatile memory chip select signals to enable the volatile memory chip 13). The dual-chip package structure 1 further includes a pull-down resistor 162, which is electrically connected to the GND pin 143 of the lead frame 14 and the second CS bonding pad 131 respectively. When the heat-dissipating exposed pad 11 is not electrically connected to the printed circuit board 10, the pull-down resistor 162 inputs pull-down signals to the second CS bonding pad 131, and the second CS bonding pad 131 receives low level signals and uses them as volatile memory chip select signals to make the volatile memory chip 13 disabled. In other words, when the second CS bonding pad 131 is in the floating state, with the pull-down resistor 162 providing pull-down signals for the second CS bonding pad 131, the volatile memory chip 13 remains in a closed or disabled state, thereby preventing conflict between the volatile memory chip 13 and the non-volatile memory chip 12 operating at the same time. In this embodiment, the GND pin 143 of the lead frame 14 is used to ground the non-volatile memory chip 12 and the volatile memory chip 13.

Preferably, the dual-chip package structure 1 further includes a fourth wire 154 for electrically connecting the pull-down resistor 162 to the GND pin 143 and the second CS bonding pad 131 respectively. It should be noted that, the fourth wire 154 can be composed of a plurality of conductive wires, and its number and connection are not limited to those shown in FIG. 3 but can be adjusted according to practical need.

Referring to FIG. 4, in one embodiment, the second CS bonding pad 131 of the volatile memory chip 13 in the dual-chip package structure 1 is activated at a low level, and the dual-chip package structure 1 further includes a pull-up resistor 161. This embodiment differs from the embodiment shown in FIG. 2 in that, the pull-up resistor 161 of this embodiment is integrated in the volatile memory chip 13, wherein the VCC bonding pad 132 of the volatile memory chip 13 is electrically connected to the VCC pin 142 of the lead frame 14, and the pull-up resistor 161 is electrically connected to the VCC bonding pad 132 and the second CS bonding pad 131 of the volatile memory chip 13 respectively. Thereby, when the heat-dissipating exposed pad 11 is not electrically connected to the printed circuit board 10, the pull-up resistor 161 inputs pull-up signals to the second CS bonding pad 131, and the pull-up signals are used as volatile memory chip select signals to make the volatile memory chip 13 disabled. In this embodiment, the pull-up resistor 161 can be a semiconductor resistance element or a weakly-driven transistor.

Preferably, the dual-chip package structure 1 further includes a fifth wire 155 (that is, VCC wire) for electrically connecting the VCC bonding pad 132 to the VCC pin 142. It should be noted that, the number and connection of the fifth wire 155 are not limited to those shown in FIG. 4 but can be adjusted according to practical need.

Referring to FIG. 5, in one embodiment, the second CS bonding pad 131 of the volatile memory chip 13 in the dual-chip package structure 1 is activated at a high level, and the dual-chip package structure 1 further includes a pull-down resistor 162. This embodiment differs from the embodiment shown in FIG. 3 in that, the pull-down resistor 162 of this embodiment is integrated in the volatile memory chip 13, wherein the GND bonding pad 133 of the volatile memory chip 13 is electrically connected to the GND pin 143 of the lead frame 14, and the pull-down resistor 162 is electrically connected to the GND bonding pad 133 and the second CS bonding pad 131 of the volatile memory chip 13 respectively. Thereby, when the heat-dissipating exposed pad 11 is not electrically connected to the printed circuit board 10, the pull-down resistor 162 inputs pull-down signals to the second CS bonding pad 131, and the second CS bonding pad 131 receives low level signals and uses them as volatile memory chip select signals to make the volatile memory chip 13 disabled. In this embodiment, the pull-down resistor 162 can be a semiconductor resistance element or a weakly-driven transistor.

Preferably, the dual-chip package structure 1 further includes a sixth wire 156 (that is, GND wire) for electrically connecting the GND bonding pad 133 to the GND pin 143. It should be noted that, the number and connection of the sixth wire 156 are not limited to those shown in FIG. 5 but can be adjusted according to practical need.

Therefore in the dual-chip package structure of the invention, the first CS bonding pad of the non-volatile memory chip is electrically connected to the CS pin of the lead frame, and the CS pin of the lead frame provides non-volatile memory chip select signals for the non-volatile memory chip. Further, the second CS bonding pad of the volatile memory chip is electrically connected to the heat-dissipating exposed pad, and the heat-dissipating exposed pad is selectively electrically connected to the printed circuit board to receive volatile memory chip select signals and transmit them to the volatile memory chip. The invention thus requires the lead frame only having eight pins but can prevent conflict between the two chips when they operate at the same time in the dual-chip package structure.

Moreover, in a burning process performed by the dual-chip package structure, when the heat-dissipating exposed pad is not electrically connected to the printed circuit board, and the second CS bonding pad is in a floating state, a resistor can be provided in the dual-chip package structure or in the volatile memory chip to input weak pull-up or pull-down signals to the second CS bonding pad so as to keep the volatile memory chip in a disabled state. This can effectively prevent conflict between the non-volatile memory chip and the volatile memory chip during the burning process of the dual-chip package structure.

The examples above are only illustrative to explain principles and effects of the invention, but not to limit the invention. It will be apparent to those skilled in the art that modifications and variations can be made without departing from the scope of the invention. Therefore, the protection range of the rights of the invention should be as defined by the appended claims.

What is claimed is:

1. A dual-chip package structure for receiving a non-volatile memory chip select signal transmitted from a printed circuit board, and for selectively receiving a volatile memory chip select signal transmitted from the printed circuit board, the dual-chip package structure including:
   a heat-dissipating exposed pad for receiving the volatile memory chip select signal;
   a non-volatile memory chip having eight bonding pads, wherein the eight bonding pads include at least a first CS bonding pad;
   a volatile memory chip having eight bonding pads, wherein the eight bonding pads include at least a second CS bonding pad;
   a lead frame having eight pins, wherein the eight pins include at least a CS pin for receiving the non-volatile memory chip select signal;
   a first CS wire electrically connected to the CS pin and the first CS bonding pad, for providing the non-volatile memory chip select signal for the first CS bonding pad; and
   a second CS wire electrically connected to the heat-dissipating exposed pad and the second CS bonding pad, for providing the volatile memory chip select signal for the second CS bonding pad.

2. The dual-chip package structure according to claim 1, further including a pull-up resistor, and the eight pins of the lead frame further including at least a VCC pin, wherein the pull-up resistor is electrically connected to the VCC pin and the second CS bonding pad respectively, and is for inputting a pull-up signal to the second CS bonding pad when the heat-dissipating exposed pad is not electrically connected to the printed circuit board, so as to allow the second CS bonding pad to receive a high level signal and use it as the volatile memory chip select signal to make the volatile memory chip disabled.

3. The dual-chip package structure according to claim 2, further including at least a third wire for electrically connecting the pull-up resistor to the VCC pin and the second CS bonding pad respectively.

4. The dual-chip package structure according to claim 2, wherein the second CS bonding pad of the volatile memory chip is activated at a low level.

5. The dual-chip package structure according to claim 1, further including a pull-down resistor, and the eight pins of the lead frame further including at least a GND pin, wherein the pull-down resistor is electrically connected to the GND pin and the second CS bonding pad respectively, and is for inputting a pull-down signal to the second CS bonding pad when the heat-dissipating exposed pad is not electrically connected to the printed circuit board, so as to allow the second CS bonding pad to receive a low level signal and use it as the volatile memory chip select signal to make the volatile memory chip disabled.

6. The dual-chip package structure according to claim 5, further including at least a fourth wire for electrically connecting the pull-down resistor to the GND pin and the second CS bonding pad respectively.

7. The dual-chip package structure according to claim 5, wherein the second CS bonding pad of the volatile memory chip is activated at a high level.

8. The dual-chip package structure according to claim 1, further including a pull-up resistor, the eight bonding pads of the volatile memory chip further including at least a VCC bonding pad, and the eight pins of the lead frame further including at least a VCC pin, wherein the pull-up resistor is integrated in the volatile memory chip, the VCC bonding pad is electrically connected to the VCC pin, and the pull-up resistor is electrically connected to the VCC bonding pad and the second CS bonding pad respectively, wherein the pull-up resistor is for inputting a pull-up signal to the second CS bonding pad when the heat-dissipating exposed pad is not electrically connected to the printed circuit board, so as to allow the second CS bonding pad to receive a high level signal and use it as the volatile memory chip select signal to make the volatile memory chip disabled, wherein the pull-up resistor is a semiconductor resistance element or a transistor.

9. The dual-chip package structure according to claim 8, wherein the second CS bonding pad of the volatile memory chip is activated at a low level.

10. The dual-chip package structure according to claim 1, further including a pull-down resistor, the eight bonding pads of the volatile memory chip further including at least a GND bonding pad, and the eight pins of the lead frame further including at least a GND pin, wherein the pull-down resistor is integrated in the volatile memory chip, the GND bonding pad is electrically connected to the GND pin, and the pull-down resistor is electrically connected to the GND bonding pad and the second CS bonding pad respectively, wherein the pull-down resistor is for inputting a pull-down signal to the second CS bonding pad when the heat-dissipating exposed pad is not electrically connected to the printed circuit board, so as to allow the second CS bonding pad to receive a low level signal and use it as the volatile memory chip select signal to make the volatile memory chip disabled, wherein the pull-down resistor is a semiconductor resistance element or a transistor.

11. The dual-chip package structure according to claim 10, wherein the second CS bonding pad of the volatile memory chip is activated at a high level.

12. The dual-chip package structure according to claim 1, wherein the non-volatile memory chip is FLASH chip, and the volatile memory chip is SRAM chip.

13. The dual-chip package structure according to claim 1, wherein the non-volatile memory chip and the volatile memory chip are each a SPI chip, Dual-SPI chip or Quad-SPI chip having at least eight bonding pads.

14. The dual-chip package structure according to claim 1, wherein the heat-dissipating exposed pad is electrically connected to the printed circuit board.

* * * * *